United States Patent [19]

Kelly et al.

[11] Patent Number: 5,021,864
[45] Date of Patent: Jun. 4, 1991

[54] DIE-MOUNTING PADDLE FOR MECHANICAL STRESS REDUCTION IN PLASTIC IC PACKAGES

[75] Inventors: Douglas M. Kelly; Ward D. Parkinson; Timothy J. Allen, all of Boise, Id.

[73] Assignee: Micron Technology, Inc., Boise, Ill.

[21] Appl. No.: 483,977

[22] Filed: Feb. 20, 1990

Related U.S. Application Data

[63] Continuation of Ser. No. 403,894, Sep. 5, 1989, abandoned, which is a continuation of Ser. No. 316,402, Feb. 27, 1989, abandoned.

[51] Int. Cl.[5] .............................................. H01L 23/48
[52] U.S. Cl. ..................................... 357/70; 437/220
[58] Field of Search .................................... 357/70, 81

[56] References Cited

U.S. PATENT DOCUMENTS

| | | | |
|---|---|---|---|
| 4,331,831 | 5/1982 | Ingram et al. | 357/81 |
| 4,445,271 | 5/1984 | Grabbe | 29/589 |
| 4,794,431 | 12/1988 | Park | 357/70 |
| 4,797,726 | 1/1989 | Manabe | 357/70 |
| 4,809,054 | 2/1989 | Waldner | 357/70 |
| 4,809,135 | 2/1989 | Yerman | 357/70 |
| 4,829,362 | 5/1989 | Tran et al. | 357/70 |
| 4,855,807 | 8/1989 | Yamaji et al. | 357/70 |

FOREIGN PATENT DOCUMENTS

| | | | |
|---|---|---|---|
| 0115552 | 9/1981 | Japan | 357/70 |
| 0199547 | 11/1983 | Japan | |
| 0004246 | 1/1985 | Japan | |
| 0016555 | 1/1986 | Japan | 357/70 |
| 0084841 | 4/1986 | Japan | |
| 0015844 | 1/1987 | Japan | |
| 0136056 | 6/1987 | Japan | |
| 0137859 | 6/1987 | Japan | 357/70 |
| 0252159 | 11/1987 | Japan | |
| 0042156 | 2/1988 | Japan | |
| 0056948 | 3/1988 | Japan | |
| 0117453 | 5/1988 | Japan | 357/70 |

*Primary Examiner*—Andrew J. James
*Assistant Examiner*—Viet Q. Nguyen
*Attorney, Agent, or Firm*—Angus C. Fox, III; Stanley N. Protigal

[57] ABSTRACT

An improved die-mounting paddle for mechanical stress reduction in plastic integrated circuit packages. The paddle, which is incorporated in a leadframe, comprises multiple, coplanar floating sub-paddles, each of which is attached to a support beam by a flexible coil, thus allowing a large die to remain firmly attached to each of the pads, in spite of differences in the coefficients of expansion between the leadframe paddle metal and the die that might well result in bonding wire breakage or die breakage if a conventional single large paddle were utilized.

10 Claims, 9 Drawing Sheets

DIE-MOUNTING PADDLE FOR MECHANICAL STRESS REDUCTION IN PLASTIC IC PACKAGES

This is a continuation of co-pending application Ser. No. 403,894, filed on Sept. 5, 1989, which is a continuation of Ser. No. 316,402, filed on Feb. 27, 1989 now abandoned.

FIELD OF THE INVENTION

This invention relates generally to semiconductor integrated circuit (IC) packaging, and specifically to improvements in lead frames used in plastic packaging.

PRIOR ART

In the manufacture of ICs, circuits are fabricated on thin circular silicon wafers up to six or more inches in diameter. The fabrication process is very complex, but the result is a wafer with what looks like a checkerboard pattern on its face side. Each of these "checkerboard" squares is an IC, also called a "die" or "chip," manufactured right into the wafer.

The dice in wafer form, however, are not usable. Each must be isolated and "assembled" inside of a protective package. Although there are many types of packaging available, plastic encapsulation is of primary interest here. As shown in FIG. 1, a plastic package has four primary components: a metallic lead frame 1; a die 2, attached to a mounting surface 3 called a "paddle" in the lead frame; wires 4 bonded from pads on the die to leads 5 in the lead frame; and plastic 6 which encapsulates the die 2 and paddle 3 and holds the leads 5 in place after the lead frame 1 is trimmed away and the leads formed assembly process is described below.

FIG. 2 is a top plan view of an IC package following leadframe trimming and lead forming. FIG. 3 is a cross-sectional view of the package depicted in FIG. 2, taken through the vertical plane represented by broken line A—A. It is evident that the larger the package's die-mounting paddle 3, the less space available for anchoring the leads 5 within the encapsulating plastic 6. In the cross-sectional view of FIG. 3, the die is shown bonded to the paddle 3 with cured epoxy paste 8.

A typical assembly process for plastic-encapsulated integrated circuit packages will be described below. Five steps of the process are described; wafer dicing, die attachment, wire bonding, die protection, plastic encapsulation, leadframe trimming, and lead forming.

The wafer is mounted face up on adhesive plastic, called a "stickyback." The stickyback holds the wafer in place while it is cut apart into separate dice by a high speed circular saw moving across the wafer face, between the dice. After cutting, the dice are all still held in place by the stickyback.

A die is then picked off of the stickyback and adhesively attached to a paddle. Typically, but not exclusively, the adhesive used is an epoxy tape or paste, which is then thermally cured to produce a die bond. The next step is wirebond, where wires are bonded to pads on the die and to leads in the lead frame, providing conductive paths from the die to the leads. A coating of a material such as polyimide is then applied to the die at a diecoat step, said coating to protect the die face during encapsulation, and also to improve radiation immunity.

The die is then encapsulated in plastic (generally by transfer molding), and the lead frame is trimmed and formed. Trimming is the isolation of the leads and the paddle from each other and the frame. Since the plastic now holds the components together, the leads and paddle do not need the support of the lead frame, so the frame is trimmed away. Forming is the bending of the trimmed leads to a proper orientation, as shown in FIGS. 2 and 3. After more testing the package is marked to indicate the product type and grade.

In the process described above, the paddle has a continuous surface. Epoxy holds the die on the paddle during wirebond and encapsulation, but after encapsulation plastic becomes the primary holder and gives the package its physical integrity. Not only is the plastic significant in holding the package together, in physically protects the die from the outside world.

This packaging method works well when the die has a significantly smaller area than the package. Packages must be kept as small as possible to reduce circuit density. Typically, at the onset of each new generation of semiconductor devices, dice are large in comparison with the size of the package. However, increasing circuit ability is also a must to preserve marketability. This necessitates that less plastic encapsulates and holds a larger die, which results in lower package integrity and reliability. One solution is simply to make the paddle bigger, but this is not practical when the paddle has already been enlarged as much as possible for the limiting package size.

Another problem is that the silicon die has a lesser coefficient of thermal expansion (0.0003% per degree Celsius) than the metal paddle (in the range of 0.0013% or more per degree Celsius). This means that the paddle expands or contracts more than the die when the package is heated or cooled. A greater die bond area causes a greater force to be exerted on the bond and die by the difference in expansions, because expansion is larger for a larger surface. If the bond breaks for a die that is much smaller than the package, there is enough plastic to preserve the package integrity. If, however, the bond breaks for a die size approaching the package size, there is not enough plastic to preserve package integrity. If the die breaks instead of the bond, package integrity suddenly loses its purpose.

This problem is intensified in surface mount packages, such as, for example, the Small Outline J-lead (SOJ) package shown in FIGS. 2 and 3, which undergo higher thermal stresses due to their low profile and closeness of the leads to the package. When the surface mount package is soldered to a circuit board, the soldering heat is more quickly transferred to the package due to its compact nature, and thermal stress results as the die and the paddle expand, each at their own rate.

The problem of package integrity for a die that approaches to total package size may be ameliorated by mounting the die on a perforated paddle (i.e., one that contains one or more apertured). The apertures allow the encapsulating plastic to better grip the paddle, thus improving package integrity. In addition, since less metal is present within the paddle, the force that the paddle may exert on the die is somewhat reduced.

The use of apertures in a die-mounting paddle mandate that die bonding be performed with epoxy tape rather than paste, to prevent epoxy from passing through the apertures to assembly machinery (a rather messy and undesirable situation). Epoxy tape holds its shaped until thermally cured.

Referring now to FIG. 4 the cross sectional view of an IC package having a die mounted on a perforated paddle is depicted. The aperture is represented by the gap between the two sections of paddle 3.

Without attempting to be exhaustive, FIGS. 5 through 11 attempt to portray a number of possible paddle aperture arrangements. The broken lines on each of the figures represents the intended die mounting position.

Referring now to FIG. 12, a cross-sectional view is shown of plastic package having a single-aperture-paddle leadframe similar to that of FIG. 11. In this particular package, the die 2 is mounted on the edges of flaps 10 which are formed from a folding of the inner periphery of paddle 3.

Other techniques have been used as a substitute for a perforated paddle. For example, FIG. 13 is a plan view of a prior-art die-mounting paddle having a serrate periphery. The serrations function like the apertures, providing both better integration of the paddle with the encapsulating plastic and reduced die stress because of the reduction in metal surface area. FIG. 14 depicts a die-mounting paddle having a serrate aperture 7. The paddle depicts in FIG. 15 attempts to decouple the stress generated by a paddle of large surface area by making is bipartite.

In the prior art, U.S. Pat. No. 4,445,271, to Dimitry G. Grabbe, describes a perforated paddle used in ceramic packaging. The apertures in Grabbe are specifically for passing gases which may form during the die bonding process (column 2, lines 1 and 2).

U.S. Pat. No. 4,797,726, to Masamichi Manabe, shows die supporting plates (upon which a die is mounted) connected together by readily deformable plates, the combination to reduce thermal stress exerted on the die during a heated die bond process.

It has also been found that Mitsubishi in Japan has used a paddle with rectangular apertures close to the paddle periphery, but their purpose in this is not clear.

SUMMARY OF THE INVENTION

Although the stress generated between an IC die and the paddle on which it is bonded may be reduced somewhat by reducing the surface area of the paddle, it is possible to achieve an even greater reduction in stress with an improved paddle that is the focus of this disclosure.

The improved paddle is comprised of a number of coplanar floating sub-paddles that are coupled to a support beam via flexible coils. Since each sub-paddle is much smaller than the die, the stress generated between a sub-paddle and the portion of the die mounted thereon is far less than the stress generated between a die and paddle of comparable size. Because the improved paddle is comprised of multiple parts, adhesion between the paddle and the encapsulating plastic of the package is enhanced over than of a solid paddle.

DETAILED DESCRIPTION OF THE PREFERRED EMBODIMENT

Figure 1:
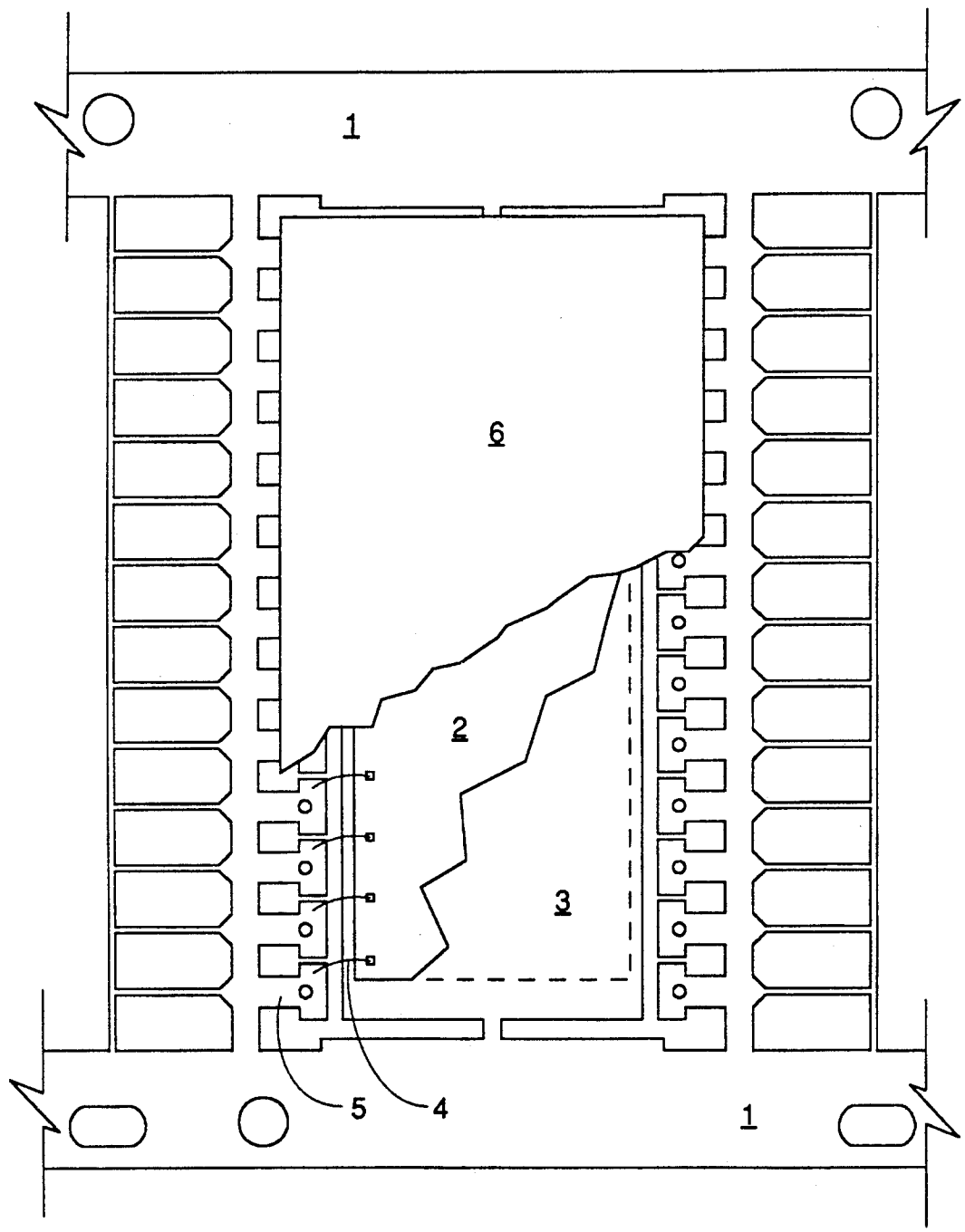
FIG. 1 is a top plan view of an untrimmed, unformed, prior art, plastic-encapsulated package, having cutaway portions of the plastic encapsulation material and the IC die.
Figure 2:
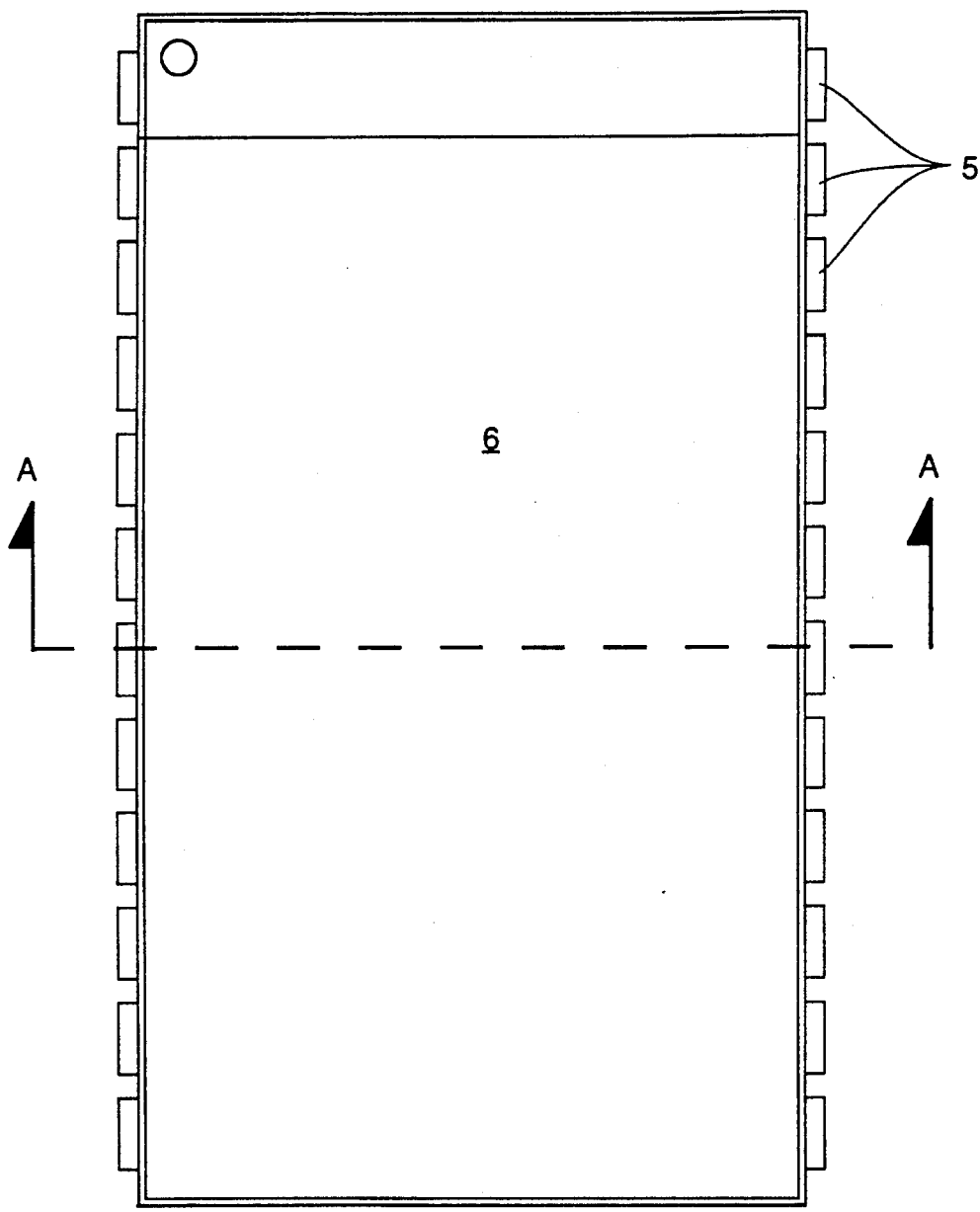
FIG. 2 is a plan view of the prior art package of FIG. 1, following trimming of the leadframe and forming of the leads.
Figure 3:
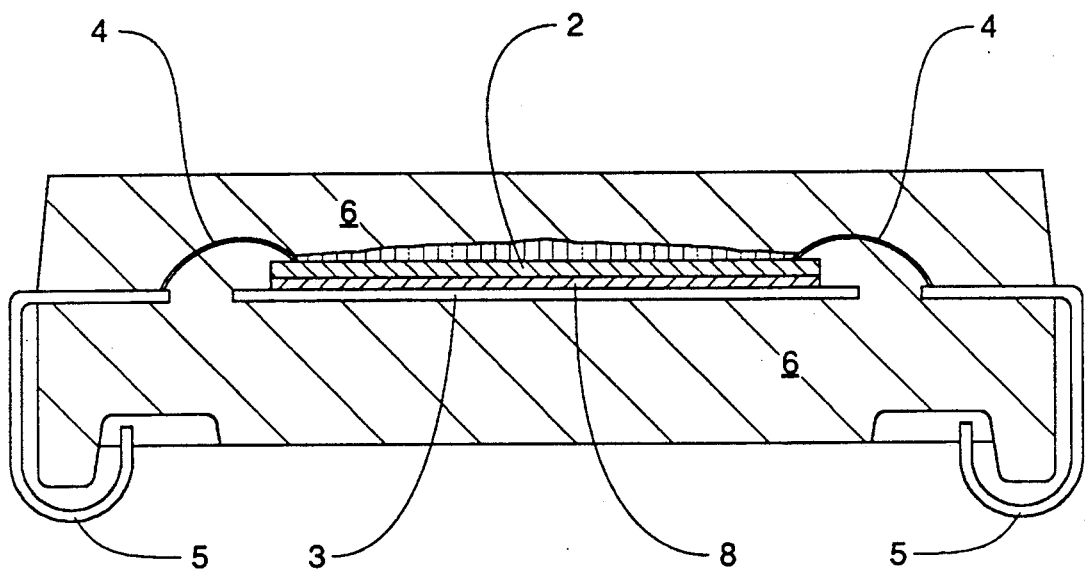
FIG. 3 is a cross-sectional view of the prior art package of FIG. 2, taken through a vertically-intersecting plane represented by broken line A—A.
Figure 16:
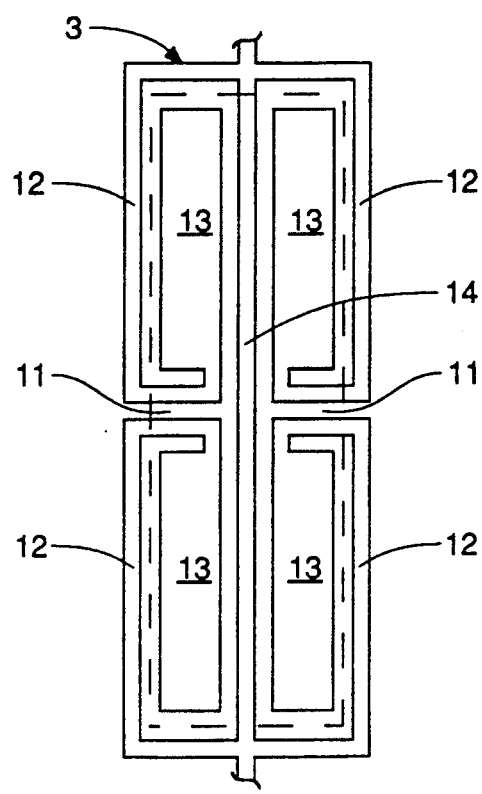
FIG. 16 is a plan view of a die-mounting paddle comprised of four floating sub-paddles.

Referring now to FIG. 16, the improved die-mounting paddle has four coplanar floating sub-paddles 13, each of which is attached to a leadframe support beam 14 via a flexible coil 12. The paddle (which by definition, encompasses the coils 12, sub-paddles 13, and support beam 14), as well as the leadframe which incorporates such a paddle (FIG. 1 depicts the manner of incorporation) are stamped or etched from a single sheet of metal. Prior to As in the other FIGS, the broken line represents the intended die-mounting position on the paddle. Although each sub-paddle has a coefficient of expansion that is different than the mounted die (metal generally has a high coefficient of expansion than silicon), the surface area of the sub-paddle is small compared to the overall size of the die. Hence, stress is greatly reduced in comparison to that which is generated between a paddle and a die of similar size.

Figure 17:
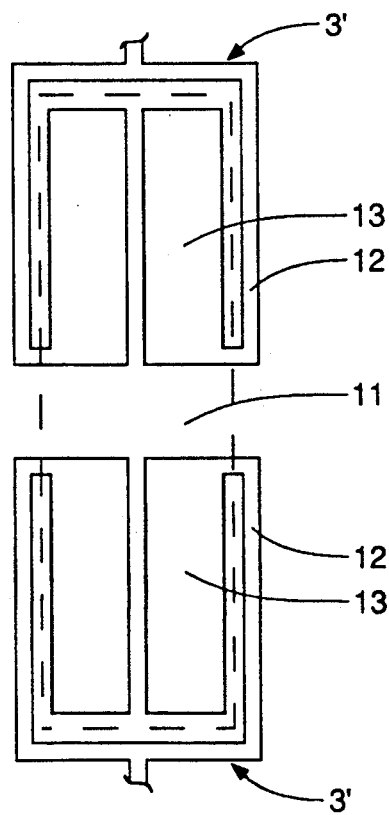
FIG. 17 is a plan view of a split die-mounting paddle incorporating four floating sub-paddles.

Referring now to FIG. 17, a modification of the improved paddle depicted in FIG. 16 eliminates the majority of the support beam 14, such that the upper pair of sub-paddles 13 are entirely decoupled from the lower pair.

Although only a pair of embodiments of the invention have been disclosed herein, it will be obvious to one having ordinary skill in the art that modifications may be made thereto without departing from the scope and spirit of the invention as claimed.

Figure 4:
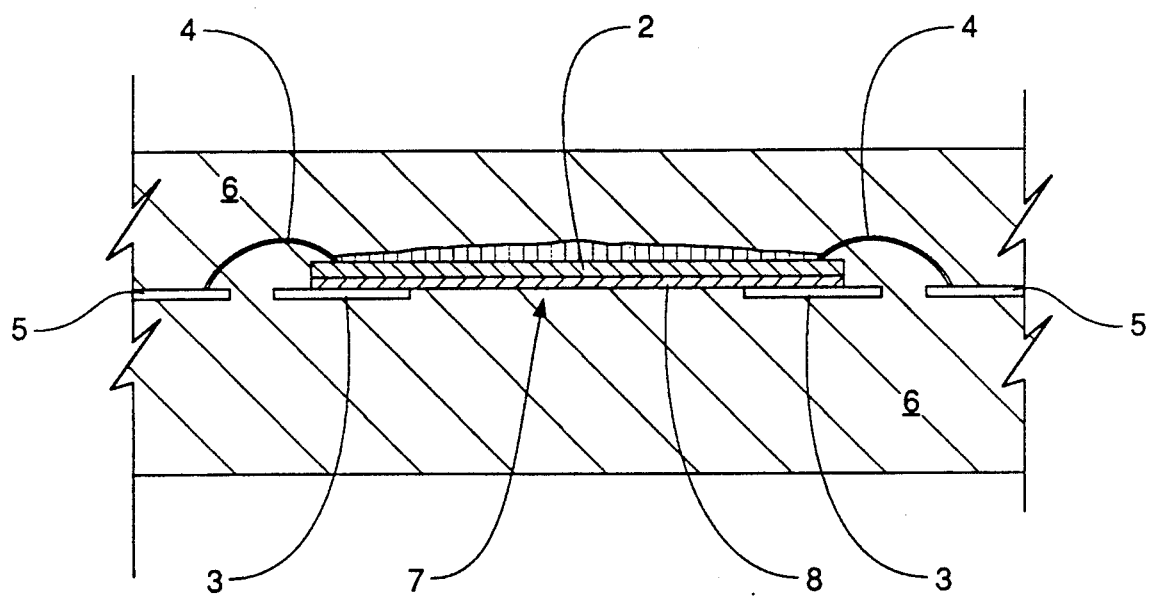
FIG. 4 is a cross-sectional view of a prior art package similar to that of FIG. 3, the difference being that the die-mounting paddle includes apertures for better die adhesion.
Figure 5:
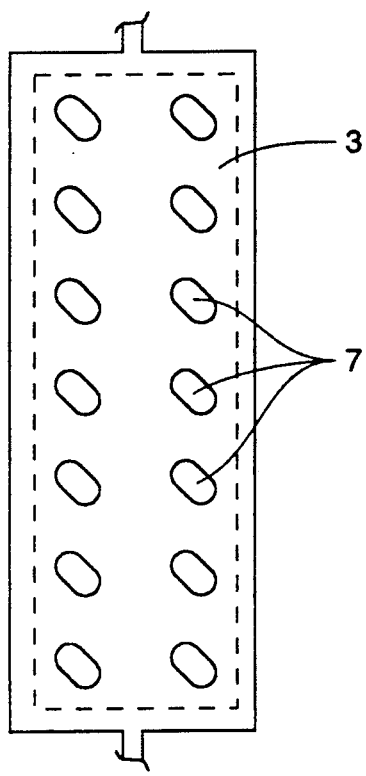
FIGS. 5 through 11 are plan views of various prior-art, aperture-containing die-mounting paddles.
Figure 6:
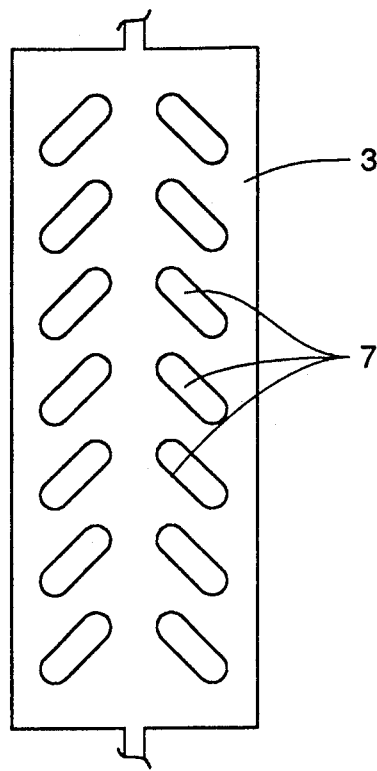
Figure 7:
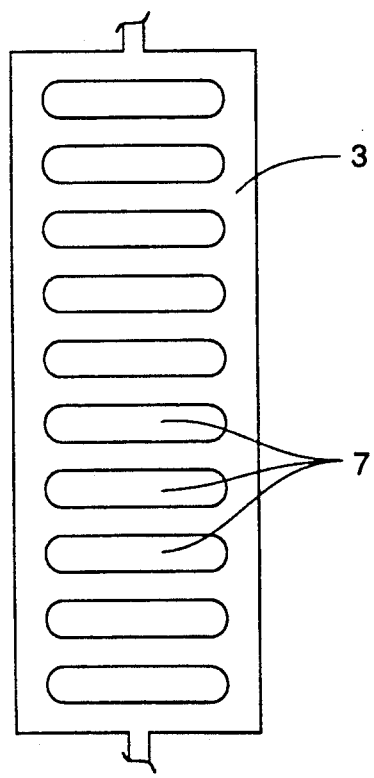
Figure 8:
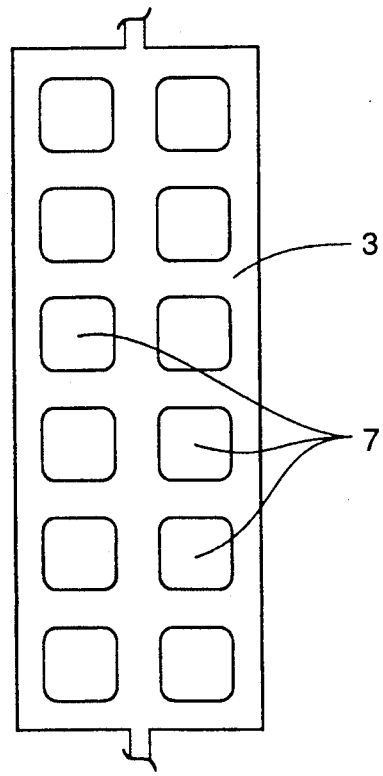
Figure 9:
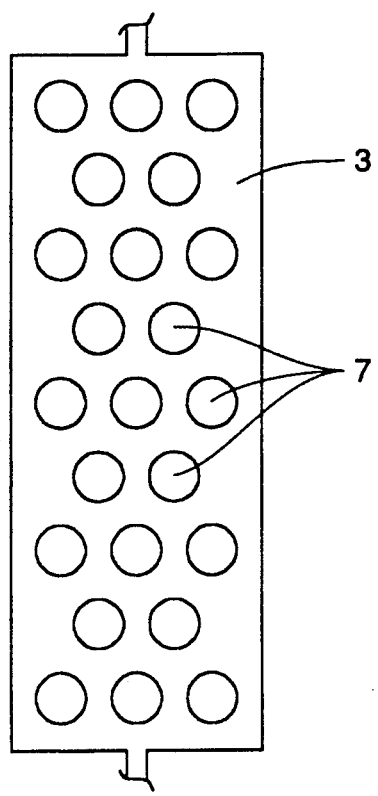
Figure 10:
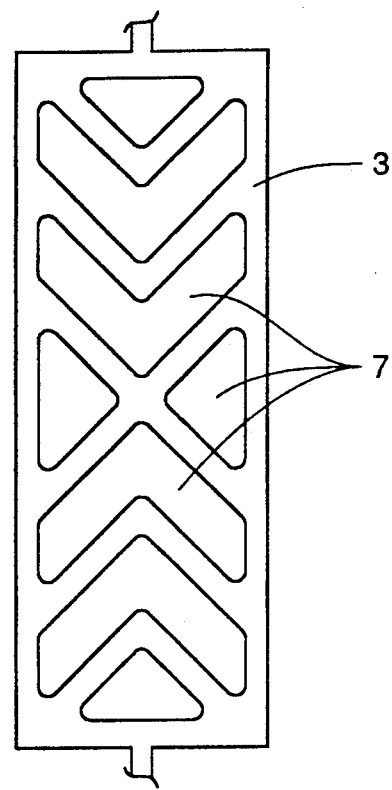
Figure 11:
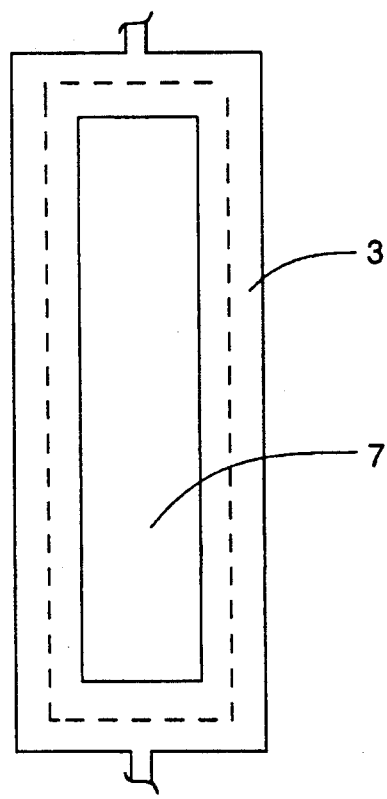
Figure 12:
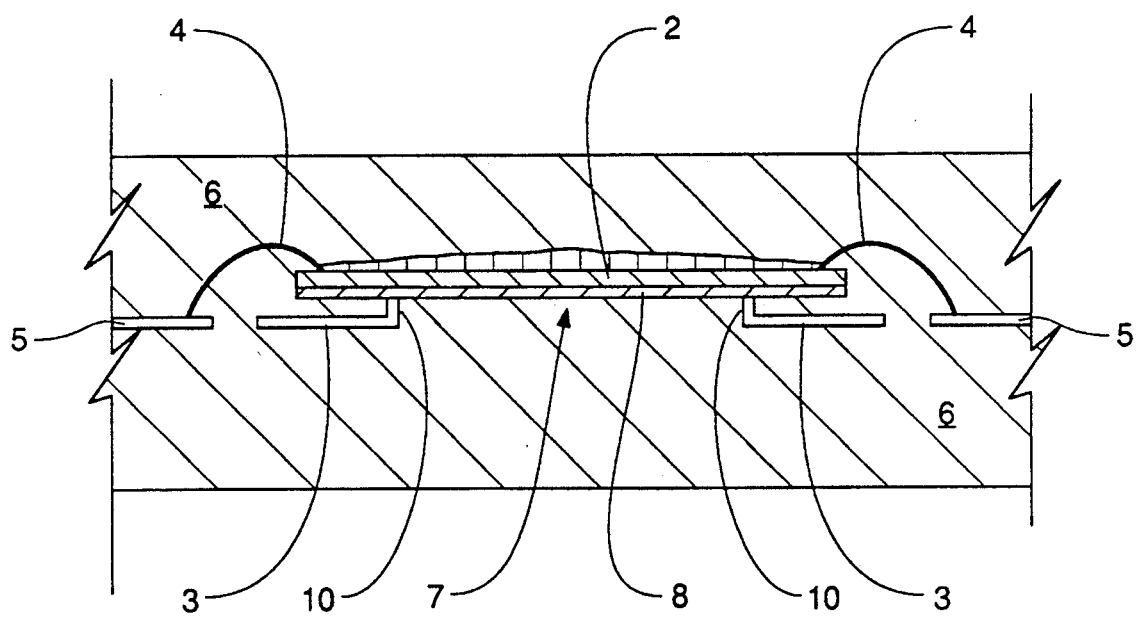
FIG. 12 shows a cross-sectional view of plastic package having a single aperture leadframe similar to that of FIG. 11, and a die mounted on the edges of flaps which are formed from a folding of the aperture periphery.
Figure 13:
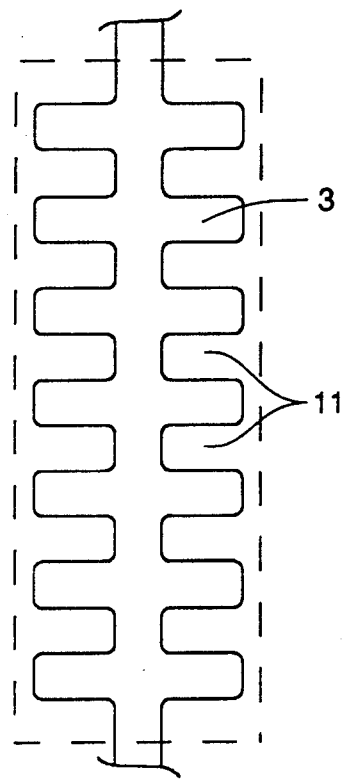
FIG. 13 is a plan view of a prior-art die-mounting paddle having a serrate periphery.
Figure 14:
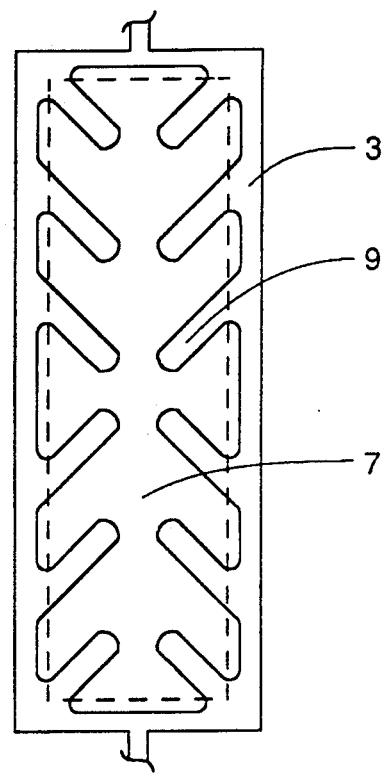
FIGS. 14 is a plan view of a prior-art die-mounting paddle having a single serrate aperture.
Figure 15:
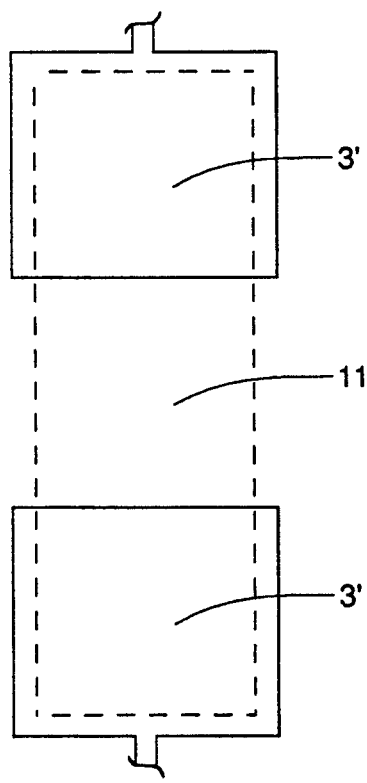
FIG. 15 is a plan view of a split die-mounting paddle.

A preferred embodiment is shown in FIG. 4, where paddle 3 is shaped by apertures 11 into four separate coils 12, each, coil 12 having a mounting pad 13, the paddle 3 having a support beam 14 down its center.

It should be understood that embodiments other than described here can incorporate the invention. This includes various aperture shapes, numbers, and arrangements, or combinations thereof. It should also be understood that the invention applies to IC packages in general, of whatever style, as long as the package has a paddle or similar mounting surface to receive an IC, and the apertures are to improve thermal and physical integrity of the package in the manner described herein. This may include packages that use nonplastic packaging material and nonepoxy die bond agents.

We claim:

1. A metal die-mounting paddle, for incorporation in a leadframe used for plastic-encapsulated integrated circuit packages, said paddle comprising:

a support beam;

a plurality of sub-paddles to which a semiconductor die will be bonded; and a coil for each sub-paddle, each of said coils having a first end attached to said support beam, and a second end attached to only one of said sub-paddles, said coils being deformable to allow said sub-paddles to move with respect to one another to compensate for differences in thermal expansion between a semiconductor die mounted on said paddle and the metal from which said paddle is fabricated.

2. The die-mounting paddle of claim 1, wherein said paddle comprises four sub-paddles, for coils, and a single support beam, said coils and sub-paddles being grouped in first and second pairs, the first ends of said first pair of coils being attached to a first end of said support beam, and the first ends of said second pair of coils being attached to a second end of said support beam, said support beam being disposed between said first pair of sub-paddles and between said second pair of sub-paddles.

3. A metal die-mounting paddle, for incorporation in a leadframe used for plastic-encapsulated integrated circuit packages, said paddle comprising:

(a) a support beam crossing the area defined by said paddle's perimeter;

(b) a plurality of coplanar sub-paddles to which a semiconductor die may be bonded; and (c) a plurality of flexible coils, each of which interconnects said support beam with a single sub-paddle, said coils being deformable to allow said sub-paddles to move coplanarly with respect to one another to compensate for differences in thermal expansion between the semiconductor die and the metal from which said paddle is fabricated.

4. The die-mounting paddle of claim 3, wherein each of said sub-paddles is rectangular in shape, and each of said coils is L-shaped and wraps around a portion of the periphery of its associated sub-paddle.

5. The die-mounting paddle of claim 4, wherein each of said coils wraps around at least two sides of its associated sub-paddle.

6. A metal die-mounting paddle for incorporation in a leadframe used for plastic-encapsulated integrated circuit packages, said paddle comprising a support beam to which the paddle is tied at opposite ends to the leadframe, a plurality of coplanar sub-paddles, and a coil interconnecting each sub-paddle with said support beam, said coils being deformable to allow said sub-paddles to move with respect to one another to compensate for differences in thermal expansion between a semiconductor die mounted on said paddle and the metal from which said paddle is fabricated.

7. The die-mounting paddle of claim 6, wherein said paddle comprises four sub-paddle, four coils, and a single support beam.

8. The die-mounting paddle of claim 7, wherein the coils and sub-paddles are grouped in first and second pairs, the first ends of said first pair of coils being attached to one end of said support beam, and the first ends of said second pair of coils being attached to the other end of said support beam, and said support beam is disposed between said first pair of sub-paddles and between said second pair of sub-paddles.

9. The die-mounting paddle of claim 8, wherein said paddle and the leadframe in which it is incorporated, are stamped from a single sheet of metal.

10. The die-mounting paddle of claim 8, wherein said paddle and the leadframe in which it is incorporated, are etched from a single sheet of metal.

* * * * *